(12) United States Patent
Kitatani

(10) Patent No.: US 7,072,631 B2
(45) Date of Patent: Jul. 4, 2006

(54) MOBILE COMMUNICATION TERMINAL AND METHOD OF CALIBRATING FREQUENCY IN THE SAME

(75) Inventor: Kenichi Kitatani, Tokyo (JP)

(73) Assignee: NEC Corporation, Tokyo (JP)

( * ) Notice: Subject to any disclaimer, the term of this patent is extended or adjusted under 35 U.S.C. 154(b) by 484 days.

(21) Appl. No.: 10/425,955

(22) Filed: Apr. 30, 2003

(65) Prior Publication Data

US 2003/0211837 A1 Nov. 13, 2003

(30) Foreign Application Priority Data

May 9, 2002 (JP) .............................. 2002-133581

(51) Int. Cl.
*H04B 1/18* (2006.01)

(52) U.S. Cl. .............................. 455/192.1; 455/192.2; 455/265; 455/182.2; 342/357.1; 342/357.12

(58) Field of Classification Search ............ 455/192.1, 455/192.2, 456.5, 456.6, 425, 424, 575.1, 455/550.1, 418, 420, 427, 456.3, 561, 502, 455/182.2, 183.2, 186.1, 88, 125, 71, 75, 455/120, 123, 173.1, 182.1, 255, 265, 318; 375/134, 145, 149, 362; 342/357.12, 357.1, 342/357.09, 357.15, 337.14, 120, 121, 174
See application file for complete search history.

(56) References Cited

U.S. PATENT DOCUMENTS

| | | | | |
|---|---|---|---|---|
| 5,119,504 A | * | 6/1992 | Durboraw, III | 455/556.2 |
| 5,535,432 A | * | 7/1996 | Dent | 455/77 |
| 5,663,735 A | * | 9/1997 | Eshenbach | 342/357.15 |
| 5,717,403 A | * | 2/1998 | Nelson et al. | 342/357.12 |
| 5,841,396 A | * | 11/1998 | Krasner | 342/357.02 |
| 5,867,533 A | * | 2/1999 | Fleek et al. | 375/279 |
| 5,982,324 A | * | 11/1999 | Watters et al. | 342/357.06 |
| 6,041,222 A | * | 3/2000 | Horton et al. | 455/255 |
| 6,064,336 A | | 5/2000 | Krasner | |
| 6,122,506 A | * | 9/2000 | Lau et al. | 455/427 |
| 6,208,290 B1 | * | 3/2001 | Krasner | 342/357.05 |
| 6,741,842 B1 | * | 5/2004 | Goldberg et al. | 455/192.2 |
| 6,816,111 B1 | * | 11/2004 | Krasner | 342/357.12 |
| 6,828,937 B1 | * | 12/2004 | Hilgeman et al. | 342/465 |
| 6,889,051 B1 | * | 5/2005 | Ogino et al. | 455/456.1 |
| 2001/0034210 A1 | * | 10/2001 | Nir et al. | 455/71 |
| 2003/0068977 A1 | * | 4/2003 | King | 455/12.1 |
| 2003/0176204 A1 | * | 9/2003 | Abraham | 455/556.1 |
| 2003/0214436 A1 | * | 11/2003 | Voor et al. | 342/418 |

FOREIGN PATENT DOCUMENTS

JP 8-56153 A 2/1996

(Continued)

*Primary Examiner*—Edward F. Urban
*Assistant Examiner*—Charles Chow
(74) *Attorney, Agent, or Firm*—Sughrue Mion, PLLC

(57) ABSTRACT

A mobile communication terminal includes (a) a first unit for calibrating a frequency, (b) a global positioning system (GPS) module, and (c) a processor which electrically connects the first unit and the global positioning system module to each other. The first unit counts the number of an intermediate frequency (IF) signal generated by converting a frequency of a signal transmitted from a base station, the processor coverts a count of the intermediate signal obtained while the first unit is in lock-up condition, into a real count offset, and the global positioning system module counts the number of a signal transmitted from a circuit which generates an operational frequency of the mobile communication terminal, and calibrates the number of the signal with the real count offset.

21 Claims, 8 Drawing Sheets

FOREIGN PATENT DOCUMENTS

| | | |
|---|---|---|
| JP | 11-513787 A | 11/1999 |
| JP | 11-355102 A | 12/1999 |
| JP | 2000-506348 A | 5/2000 |
| WO | WO 03/032516 A1 | 4/2003 |

* cited by examiner

MOBILE COMMUNICATION TERMINAL AND METHOD OF CALIBRATING FREQUENCY IN THE SAME

BACKGROUND OF THE INVENTION

1. Field of the Invention

The invention relates to a mobile communication terminal such as a cellular phone, including therein a global positioning system module which is necessary to generate an accurate frequency or calibrate a frequency into an accurate frequency, and a method of calibrating a frequency in such a mobile communication terminal.

2. Description of the Related Art

Recently, in a field of mobile communication, both of a service provider and a service receiver wait for a service of providing data indicative of a position of a user. If a user could know not only where he/she is and/or where his/her friends are, but also geographic data such as shops or transportation around where a user is, data about entertainment such as which movie a user can see now and what time a movie starts, and/or news about traffics, richer communication society can be accomplished.

A principle of detecting a position of a user or others is in measurement of a time necessary for a radio signal to reach a terminal to thereby measure a distance between a first terminal which transmits a radio signal and a second terminal which receives the radio signal transmitted from the first terminal.

In order to measure a time necessary for a radio signal to reach a terminal, the terminal would be necessary to have a function of transmitting a signal having an accurate frequency or calibrating a frequency of a signal into an accurate frequency. This is because a distance is much influenced by the accuracy.

However, an oscillator which transmits a signal having a frequency with high accuracy is large in size, and further, a terminal including such an oscillator is high in fabrication cost.

Even if a mobile communication terminal had an oscillator which transmits a signal having a frequency with high accuracy, a frequency of a signal transmitted from the oscillator would be fluctuated due to variance in an ambient temperature and environmental conditions.

Hence, it would be more practical for a mobile communication terminal to calibrate a frequency than to have a function of transmitting a signal having an accurate frequency. Even so, it is necessary for a mobile communication terminal to be able to transmit a signal having a frequency with high accuracy, even if frequency is calibrated.

A mobile communication terminal generally has its inherent function of calibrating a frequency of a signal transmitted therefrom, regardless of whether it includes a GPS module. However, an accuracy of a calibrated frequency generally cannot satisfy an accuracy required in GPS.

Hereinbelow are explained an auto-frequency calibration (AFC) and frequency calibration control (FCC) both of which a mobile communication terminal generally has. Auto-frequency calibration (AFC) means a function of automatically calibrating a frequency, and frequency calibration control (FCC) means a function of calibrating a frequency, inherent to a GPS module.

More specifically, auto-frequency calibration is defined as a function of, when a base station including an oscillator transmitting a signal having an accurate frequency makes connection with a terminal, calibrating an operational frequency of the terminal, based on a signal transmitted from the oscillator.

Auto-frequency calibration (AFC) is described in Japanese Patent Application Publications Nos. 8-56153 and 11-355102, for instance.

FIG. 1 is a block diagram of an auto-frequency calibration unit 100 having a function of auto-frequency calibration.

The auto-frequency calibration unit 100 is comprised of a down converter (D/C) 102 which receives a radio signal transmitted from a base station, through an antenna (not illustrated), converts a frequency of the received signal, and outputs an intermediate frequency (IF) signal, an auto-frequency calibration (AFC) circuit 103 which counts the number of the intermediate frequency signals transmitted from the down converter 102, and outputs a voltage in accordance with the counts, a digital-analog (D/A) converter circuit 104 which converts a voltage transmitted from the auto-frequency calibration circuit 103, into analog data, and an oscillator 105 (TCXO1) which generates an operation frequency of a terminal.

FIG. 2 is a flow chart of auto-frequency calibration carried out by the auto-frequency calibration unit 100 illustrated in FIG. 1.

After a terminal has established connection with a base station in step S501, auto-frequency calibration starts in step S502.

The auto-frequency calibration circuit 103 counts the intermediate frequency (IF) signals for a predetermined period of time, in step S503. Hereinbelow, a count of the intermediate frequency signals is called a real count.

The predetermined period of time during which the IF signals are counted is determined based on a frequency of a signal transmitted from the oscillator 105. Hence, if a signal transmitted from the oscillator 105 has an inaccurate frequency, the predetermined period of time is also inaccurate. Hereinbelow, a count of the IF signals counted by the auto-frequency calibration circuit 103 when a signal transmitted from the oscillator 105 has an accurate frequency is called an ideal count.

Then, the auto-frequency calibration circuit 103 calculated a difference between the real count and the ideal count, in step S504.

Then, the auto-frequency calibration circuit 103 judges whether the thus calculated difference between the real count and the ideal count is within a predetermined allowable range, in step S505.

If the difference is out of the predetermined allowable range (NO in step S505), the auto-frequency calibration circuit 103 carries out calibration. Specifically, the auto-frequency calibration circuit 103 calculates a control voltage to be input into the oscillator 105, based on the difference, in step S506.

The thus calculated voltage is input as a digital signal into the digital-analog converter circuit 104. The digital-analog converter circuit 104 converts the voltage into an analog signal, and then, outputs the analog signal to the oscillator 105 as a control voltage in accordance with which the oscillator 105 is controlled.

Then, the oscillator 105 outputs a signal having an accurate frequency, and the down converter 102 receives the signal from the oscillator 105. As a result, the down converter 102 can transmits an intermediate frequency signal having a more accurate frequency.

The steps S503, S504 and S505 are repeatedly carried out until a difference between the real count and the ideal count becomes within the predetermined allowable range. If the difference becomes with the predetermined allowable range (YES in step S505), the auto-frequency calibration circuit 103 finishes the calibration, and starts next calibration.

A condition in which a real count of the IF signal is within a predetermined allowable range, and hence, the auto-frequency calibration circuit 103 does not carry out calibration is called a lock-up condition.

A lock-up condition means that a frequency of a signal transmitted from the oscillator 105 is calibrated.

The auto-frequency calibration circuit 103 continues counting the IF signals even in a lock-up condition. If the difference is out of the predetermined allowable range (NO in step S505), the auto-frequency calibration circuit 103 restarts the calibration mentioned above.

The above-mentioned predetermined allowable range with which a difference between the real count and the ideal count is compared corresponds to an accuracy of a frequency in a lock-up condition of auto-frequency calibration.

Hereinbelow is explained frequency calibration control (FCC).

Frequency calibration control (FCC) means a function of calibrating a frequency, inherent to a GPS module, more specifically, a function of outputting data in accordance with which an operational frequency of a GPS module is calibrated, based on an input signal having an accurate frequency. Frequency calibration control (FCC) is described in Japanese Patent Application Publication No. 2000-506348 based on PCT/US97/03512 (WO97/33382) or Japanese Patent Application Publication No. 11-513787 based on PCT/US96/16161 (WO97/14049), for instance.

FIG. 3 is a block diagram of a frequency calibration control unit 200 having a function of frequency calibration control (FCC).

The frequency calibration control unit 200 is comprised of an oscillator (TCXO2) 201 which generates and transmits a frequency signal having a frequency equal to an operational frequency of the frequency calibration control unit 200, a frequency calibration control (FCC) counter 202 which receives a reference clock signal transmitted from an external circuit (not illustrated) and the frequency signal transmitted from the oscillator 201, and counts the number of the reference clock signals, a frequency calibration control operation unit 203 which receives a count transmitted from the frequency calibration control (FCC) counter 202 and the frequency signal transmitted from the oscillator 201, and a GPS signal processor 204 which receives a signal transmitted from the frequency calibration control (FCC) operation unit 203 and the frequency signal transmitted from the oscillator 201.

Since a later mentioned GPS module operates in accordance with the frequency signal transmitted from the oscillator 201, parts constituting the frequency calibration control unit 200 operate in accordance with a frequency indicated in the frequency signal transmitted from the oscillator 201.

The reference clock signal to be input into the FCC counter 202 has an accurate frequency based on which calibration is carried out.

FIG. 4 is a flow chart showing an operation of the frequency calibration control unit 200.

The frequency calibration control starts, in step S601. The FCC counter 202 counts the number of the reference clock signals for a predetermined period of time, in step S602.

The predetermined period of time during which the reference clock signals are counted is determined based on a frequency of a signal transmitted from the oscillator 201.

Hence, if a signal transmitted from the oscillator 201 has an inaccurate frequency, the predetermined period of time is also inaccurate.

The FCC operation unit 203 calculates a difference between a real count and an ideal count of the FCC counter 203, in step S603, and outputs the difference to the GPS signal processor 204, in step S604. The difference is called "calibration data" hereinbelow.

Thus, the frequency calibration control ends, in step S605.

FIG. 5 is a block diagram of a mobile communication terminal 300 including the auto-frequency calibration unit 100 illustrated in FIG. 1 and the frequency calibration control unit 200 illustrated in FIG. 3.

As illustrated in FIG. 5, a communication antenna 106 is connected to the down converter 102 of the AFC unit 100, and a GPS antenna 205 is connected to the GPS signal processor 204 of the FCC unit 200 as a GPS module. The AFC unit 100 and the FCC unit 200 are electrically connected to each other such that a frequency signal transmitted from the oscillator (TCXO1) 105 is input into the FCC counter 202. In other words, the FCC counter 202 receives the frequency signal from the oscillator 105 as the reference clock signal.

If the AFC unit 100 is in a lock-up condition and the oscillator 105 transmits a signal having a frequency accurate to some degree, the FCC operation unit 203 and the FCC counter 202 are driven to thereby transmit the calibration data to the GPS signal processor 204.

An effective accuracy with which calibration is carried out in accordance with the frequency calibration control (FCC) is almost equal to or smaller than an effective accuracy with which calibration is carried out in accordance with the auto-frequency calibration (AFC).

SUMMARY OF THE INVENTION

In view of the above-mentioned problems in the conventional mobile communication terminal, it is an object of the present invention to provide a mobile communication terminal which is capable of calibrating a frequency with a higher accuracy than an accuracy with which calibration is carried out in accordance with the auto-frequency calibration (AFC).

It is also an object of the present invention to provide a method of calibrating a frequency in a mobile communication terminal which method is capable of doing the same.

As mentioned earlier, an effective accuracy with which calibration is carried out in accordance with the frequency calibration control (FCC) in a conventional mobile communication terminal is almost equal to or smaller than an effective accuracy with which calibration is carried out in accordance with the auto-frequency calibration (AFC). However, if a mobile communication terminal makes communication with a base station which transmits a signal having a highly accurate frequency, it would be theoretically possible for the mobile communication terminal to have an accuracy higher than an accuracy established for mobile communication. The present invention has been made on the basis of this theory, and makes it possible to carry out frequency calibration at a high accuracy in a GPS module.

In one aspect of the present invention, there is provided a mobile communication terminal including (a) a first unit for calibrating a frequency, (b) a global positioning system (GPS) module, and (c) a processor which electrically connects the first unit and the global positioning system module to each other, wherein the first unit counts the number of an intermediate frequency (IF) signal generated by converting a frequency of a signal transmitted from a base station, the processor coverts a count of the intermediate signal obtained while the first unit is in lock-up condition, into a real count offset, and the global positioning system module counts the number of a signal transmitted from a circuit which generates an operational frequency of the mobile communication terminal, and calibrates the number of the signal with the real count offset.

For instance, the first unit may be comprised of (a1) a down-converter which converts a frequency of a signal transmitted from a base station, and transmits an intermediate frequency (IF) signal, (a2) an auto-frequency calibration (AFC) circuit which counts the number of the intermediate signal transmitted from the down-converter, (a3) a digital-analog converter which converts a voltage transmitted from the auto-frequency calibration circuit, into analog data, and (a4) a first circuit which generates an operational frequency of the mobile communication terminal, and transmits a frequency signal indicative of the operational frequency.

It is preferable that the processor reads a count of the intermediate frequency signal out of the auto-frequency calibration circuit while the first unit is in lock-up condition, converts the thus read-out count into a real count offset, and outputs the real count offset.

For instance, the global positioning system module may be comprised of (b1) a second circuit which generates an operational frequency of the global positioning system module, (b2) a counter which counts the frequency signal calibrated by the first unit, (b3) a real count calibrator which receives a real count transmitted from the counter and a real count offset transmitted from the processor, and calibrates the real count with the real count offset, (b4) a calculator which calculates a difference between the real count calibrated by the real count calibrator, and an ideal count, and outputs a calibration signal indicative of the thus calculated difference, and (b5) a GPS signal processor which receives the calibration signal and a signal transmitted from a global positioning system satellite, and processes signals relating to measurement of position.

It is preferable that the real count calibrator adds the real count offset transmitted from the processor, to the real count transmitted from the counter, to thereby calibrate the real count.

It is preferable that the processor estimates an error in the operational frequency of the mobile communication terminal, based on the count of the intermediate frequency signal, calculates offset in the real count transmitted from the auto-frequency calibration circuit, based on the error, and outputs the offset as the real count offset.

It is preferable that the processor reads out the count of the intermediate frequency signal, and converts the count of the intermediate frequency signal into the real count offset in accordance with a conversion table or a conversion equation.

It is preferable that the counter counts both of a rising-up edge and a falling-down edge of a waveform of the received frequency signal.

It is preferable that the calibration signal transmitted from the calculator is fed back to the counter.

It is preferable that the calibration signal transmitted from the calculator is converted into a control voltage in accordance with which a frequency transmitted from the second circuit is calibrated.

In another aspect of the present invention, there is provided a method of calibrating a frequency in a mobile communication terminal, including the steps of (a) counting the number of an intermediate frequency (IF) signal generated by converting a frequency of a signal transmitted from a base station, (b) converting a count of the intermediate signal obtained while a first unit for calibrating a frequency in the mobile communication terminal is in lock-up condition, into a real count offset, and (c) counting the number of a frequency signal transmitted from a circuit which generates an operational frequency of the mobile communication terminal, and outputs the frequency signal indicative of the operational frequency, and calibrating the number of the frequency signal with the real count offset.

For instance, the real count may be calibrated by adding the real count offset to the real count in the step (c).

For instance, the step (b) may include the steps of estimating an error in the operational frequency of the mobile communication terminal, based on the count of the intermediate frequency signal, calculating offset in the real count of the intermediate frequency signal, based on the error, and outputting the offset as the real count offset.

For instance, the step (b) may include the steps of reading out the count of the intermediate frequency signal, and converting the count of the intermediate frequency signal into the real count offset in accordance with a conversion table or a conversion equation.

It is preferable that both of a rising-up edge and a falling-down edge of a waveform of the frequency signal are counted in the step (c).

In still another aspect of the present invention, there is provided a program for causing a computer to carry out a method of calibrating a frequency in a mobile communication terminal, processing executed by the computer in accordance with the program including (a) counting the number of an intermediate frequency (IF) signal generated by converting a frequency of a signal transmitted from a base station, (b) converting a count of the intermediate signal obtained while a first unit for calibrating a frequency in the mobile communication terminal is in lock-up condition, into a real count offset, and (c) counting the number of a frequency signal transmitted from a circuit which generates an operational frequency of the mobile communication terminal, and outputs the frequency signal indicative of the operational frequency, and calibrating the number of the frequency signal with the real count offset.

For instance, the real count may be calibrated by adding the real count offset to the real count in the processing (c).

The processing (b) may include estimating an error in the operational frequency of the mobile communication terminal, based on the count of the intermediate frequency signal, calculating offset in the real count of the intermediate frequency signal, based on the error, and outputting the offset as the real count offset.

The processing (b) may include reading out the count of the intermediate frequency signal, and converting the count of the intermediate frequency signal into the real count offset in accordance with a conversion table or a conversion equation.

It is preferable that both of a rising-up edge and a falling-down edge of a waveform of the frequency signal are counted in the processing (c).

In yet anther aspect of the present invention, there is provided a recording medium readable by a computer, storing a program as mentioned above.

The advantages obtained by the aforementioned present invention will be described hereinbelow.

In accordance with the present invention, the frequency calibration control unit as a GPS module can have calibration data with an accuracy higher than an accuracy with which calibration is carried out in the auto-frequency calibration unit. As a result, it is possible to significantly enhance an effective accuracy with which a frequency of a signal is calibrated in the frequency calibration control unit as a GPS module, shorten a time necessary for detecting a position of a user or others, and enhance an accuracy with which a position is detected.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

Figure 6:
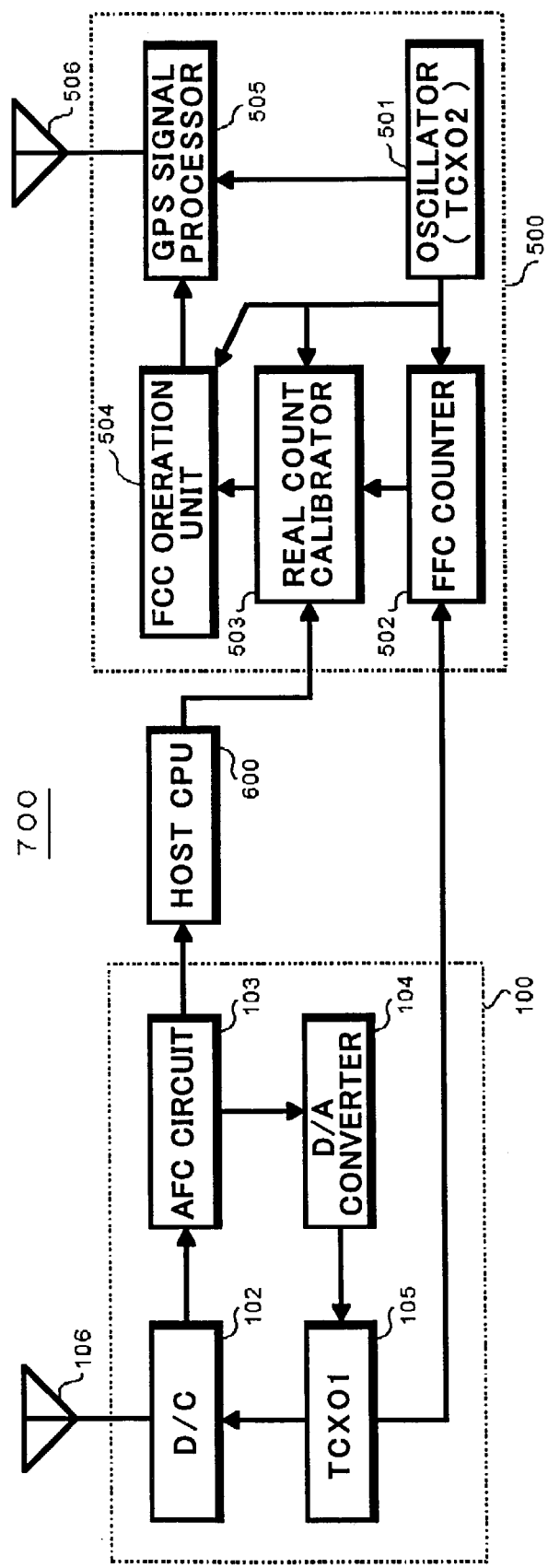
FIG. 6 is a block diagram of a mobile communication terminal in accordance with the first embodiment of the present invention.

FIG. 6 is a block diagram showing a structure of a mobile communication terminal 700 in accordance with the first embodiment of the present invention. The mobile communication terminal 700 is designed to have a network-assisted type GPS function in a personal digital cellular (PDC) system.

The mobile communication terminal 700 is comprised of an auto-frequency calibration (AFC) unit 100, a frequency calibration control (FCC) unit 500 as a GPS module, and a host central processing unit (CPU) 600 electrically connecting the AFC unit 100 and the FCC unit 500 to each other.

Figure 1:
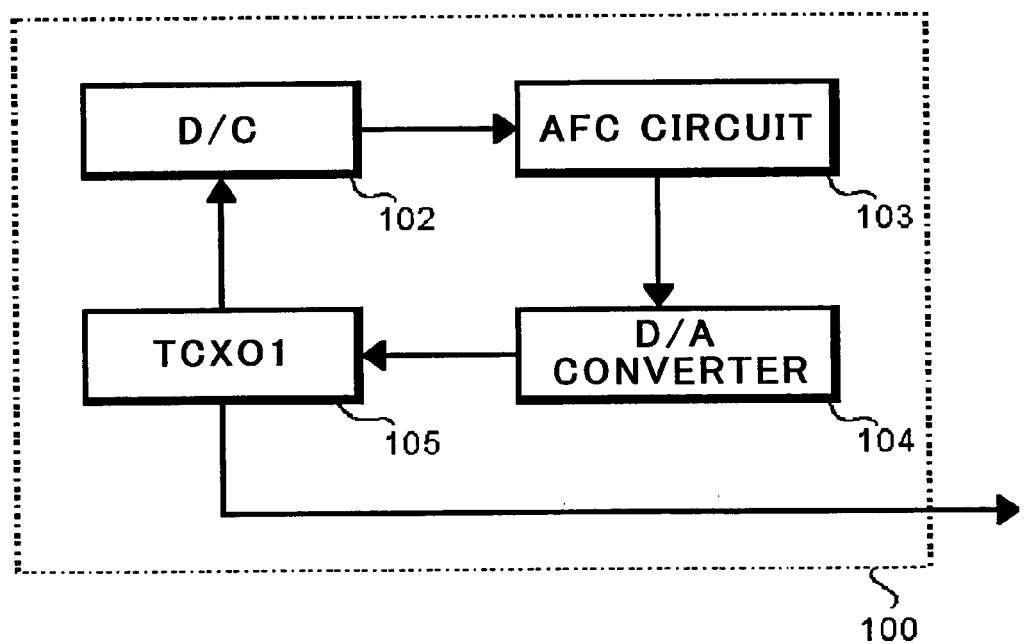
FIG. 1 is a block diagram of an auto-frequency calibration unit in a conventional mobile communication terminal.
Figure 2:
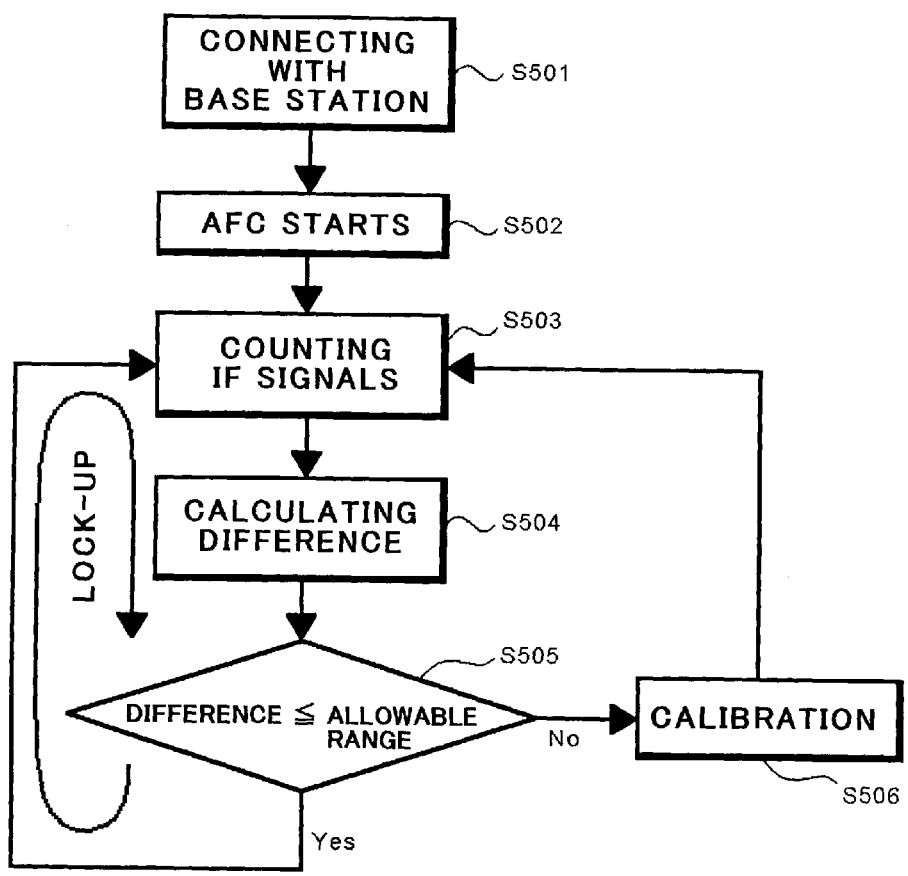
FIG. 2 is a flow chart of an operation of the auto-frequency calibration unit illustrated in FIG. 1.
Figure 3:
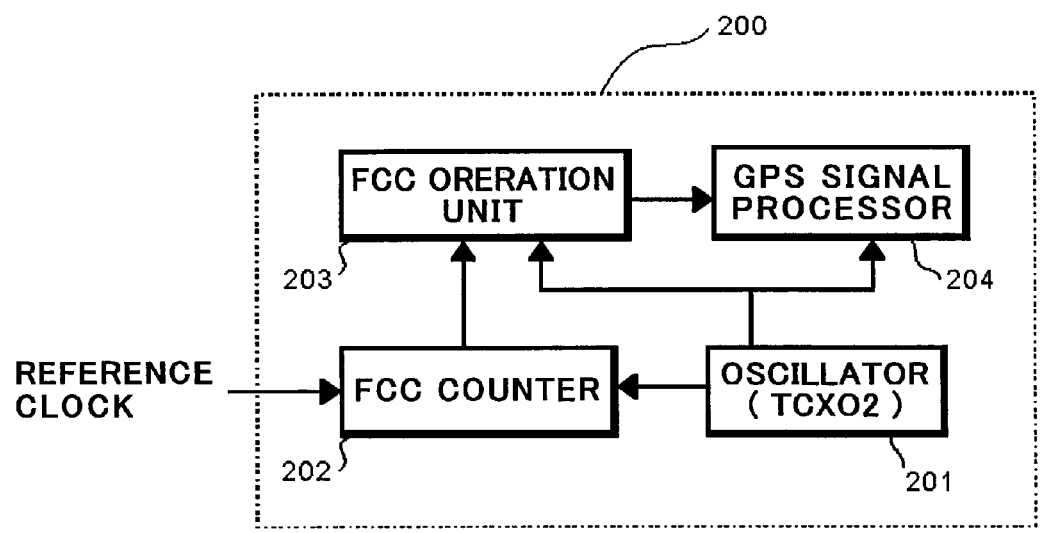
FIG. 3 is a block diagram of a frequency calibration control unit in a conventional mobile communication terminal.
Figure 4:
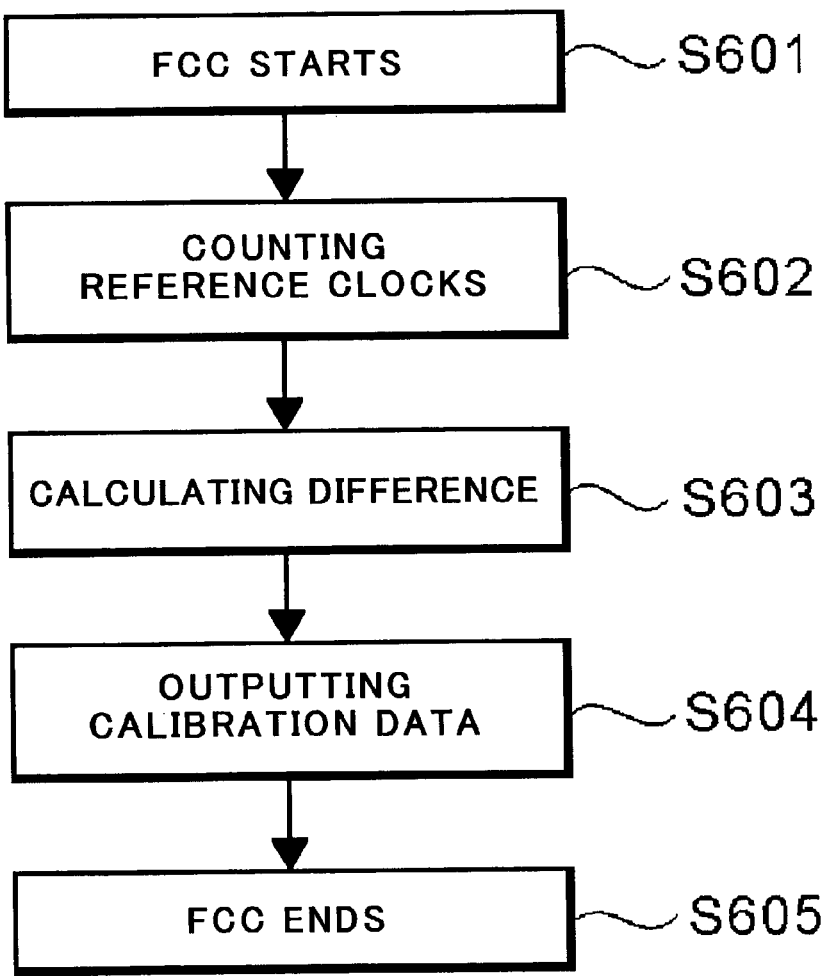
FIG. 4 is a flow chart of an operation of the frequency calibration control unit illustrated in FIG. 3.
Figure 5:
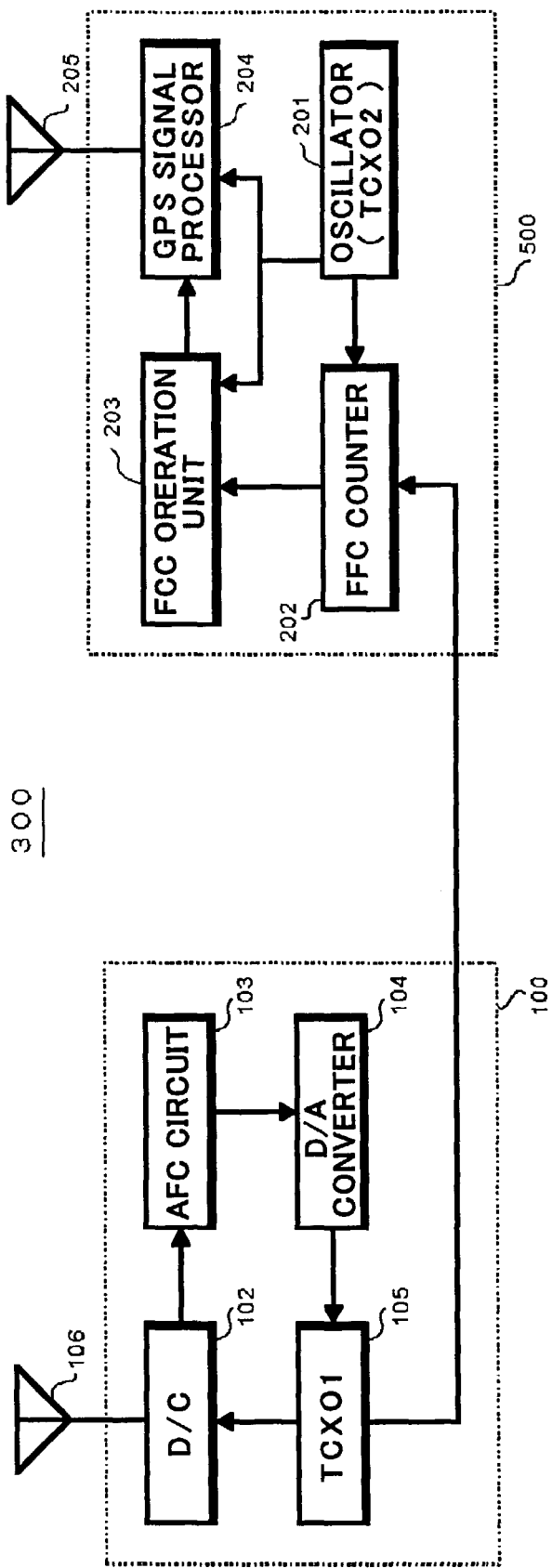
FIG. 5 is a block diagram of a conventional mobile communication terminal.

The AFC unit 100 has the same structure as the structure of the AFC unit 100 illustrated in FIG. 1 except that a communication antenna 106 is connected to the down converter 102.

The host CPU 600 reads a count of intermediate frequency (IF) signals out of the AFC circuit 103 while the AFC unit 100 is in a lock-up condition, converts the thus read-out count into a FCC real count offset, and outputs a signal indicative of the FCC real count offset.

The FCC unit 500 as a GPS module is comprised of an oscillator (TCXO2) 501 which generates and transmits a frequency signal having a frequency equal to an operational frequency of the FCC unit 500, a frequency calibration control (FCC) counter 502 which counts the number of signals transmitted from the oscillator 105, calibrated by the AFC unit 100, a real count calibrator 503 which receives a count transmitted from the FCC counter 502, the FCC real count offset transmitted from the host CPU 600 and the frequency signal transmitted from the oscillator 501, and calibrates the real count transmitted from the FCC counter 502 with the FCC real count offset transmitted from the host CPU 600, a frequency calibration control (FCC) operation unit 504 which receives a calibrated real count from the real count calibrator 503, calculates a difference between the calibrated real count and an ideal count, and outputs a signal indicative of the difference, a GPS signal processor 505 which receives the signal indicative of a difference between the calibrated real count and an ideal count, transmitted from the frequency calibration control (FCC) operation unit 504, receives radio signals transmitted from a GPS satellite, through the GPS antenna 506, and processes signals relating to measurement of a position.

Figure 7:
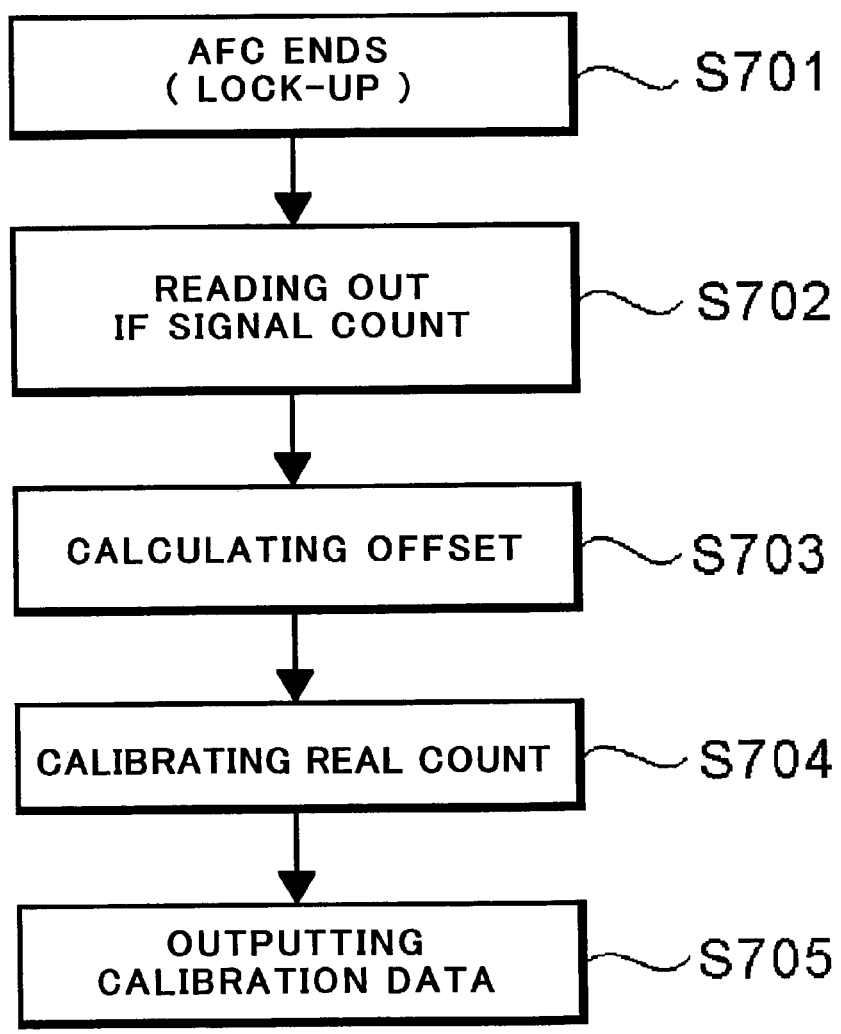
FIG. 7 is a flow chart of an operation of the mobile communication terminal illustrated in FIG. 6.

FIG. 7 is a flow chart showing respective steps to be carried out in a method of calibrating a frequency in the mobile communication terminal 700. Hereinbelow is explained a method of calibrating a frequency in the mobile communication terminal 700.

A frequency of a signal transmitted from the oscillator 105 and received in the FCC counter 502 is adjusted in a lock-up condition (step S701) such that a difference between a real count and an ideal count is within a predetermined range. Accordingly, a frequency of a signal transmitted from the oscillator 105 in a lock-up condition is less accurate than a frequency of a signal transmitted from a base station.

Since the down converter 102 in the AFC unit 100 generates an intermediate frequency signal in accordance with a frequency of a signal transmitted from the oscillator 105, a frequency of a signal transmitted from the oscillator 105 can be expressed in a linear function of a frequency of the intermediate frequency signal.

A relation between a frequency of a signal transmitted from the oscillator 105 and a frequency of the intermediate frequency signal can be determined based on a frequency of a carrier wave transmitted from a base station and a designed frequency of the intermediate frequency signal.

Accordingly, the host CPU 600 reads a real count of the intermediate frequency signal out of the AFC circuit 103 in step S702, and can determine a frequency of a signal transmitted from the oscillator 105, based on the read-out real count.

In addition, the host CPU 600 calculates an offset between a real count and an ideal count of the FCC counter 502 which offset is caused when a frequency of a signal transmitted from the oscillator 105 is not accurate, and is determined in accordance with the above-mentioned process, and transmits the thus calculated offset to the real count calibrator 503, in step S703.

The ideal count is stored in the FCC operation unit 504. The host CPU 600 may in advance transmit an ideal count to the FCC operation unit 504.

Hereinbelow is explained an example of a process of calculating a real count offset in the FCC unit 500.

It is assumed that a signal transmitted from the oscillator 105 has a designed frequency F1, but has an actual frequency F1r, and the oscillator 501 has a designed frequency F2, but has an actual frequency F2r.

It is also assumed that the FCC counter 502 counts clock signals transmitted from the oscillator 105, in one second defined by a frequency of a signal transmitted from the oscillator 501.

To be accurate, a period of time established by the oscillator 501 is a F2/F2r second.

Accordingly, a real count counted by the FCC counter 502 is expressed as follows.

$$\text{Real count} = F1r \times (F2/F2r) \quad (A)$$

The above-mentioned real count offset is equal to a difference between the real count defined by the equation (A) and a real count obtained when the actual frequency F1r is equal to the designed frequency F1 (F1r=F1). Namely, the real count offset is expressed as follows.

$$\text{Real count offset} = [F1 \times (F2/F2r) - F1r \times (F2/F2r)] = \quad (B)$$
$$[(F1 - F1r) \times (F2/F2r)]$$

In the equation (B), a pair of brackets [ ] indicates a maximum integer which is not beyond a figure indicated in the brackets.

A real count offset transmitted to the real count calibrator 503 from the host CPU 600 is an integer, in which the designed frequencies F1 and F2 are known, and the actual frequency F1r is determined by the host CPU 600 as mentioned earlier.

Though the actual frequency F2r of a signal transmitted from the oscillator 501 is unknown, a range of a ratio (F2/F2r) is determined in accordance with an accuracy of a frequency of a signal transmitted from the oscillator 501.

For instance, if the designed frequency F1 is equal to 14.4 MHz, and a frequency of a signal transmitted from the oscillator 105 in a lock-up condition has an accuracy of 0.3 ppm, a difference (F1-F1r) is in the range of -4.32 to 4.32.

On the other hand, since a frequency of a signal transmitted from the oscillator 501 has an accuracy in the range of a few ppm to tens of ppm, a ratio (F2/F2r) can be deemed approximately equal to one (F2/F2r≈1).

Accordingly, it is possible to approximate the real count offset to [F1-F1r].

$$\text{Real count offset} \approx [F1 - F1r]$$

Since the designed frequency F1 of a signal transmitted from the oscillator 105 is fixed, the real count offset is determined to be one integer in dependence on the actual frequency F1 of a signal transmitted from the oscillator 105.

As mentioned above, it is possible to calculate a frequency of a signal transmitted from the oscillator 105, based on a real count of the intermediate frequency signal counted by the AFC circuit 103, and a real count offset of the FCC counter 502, based on a frequency of a signal transmitted from the oscillator 105.

The host CPU 600 converts a real count of the intermediate frequency signals into a real count offset of the FCC counter 502, and transmits the real count offset to the real count calibrator 503.

The real count calibrator 503 adds the real count received from the FCC counter 502 to the real count offset received from the host CPU 600.

Thus, the real count is calibrated to a real count obtained when a signal transmitted from the oscillator 105 has an accurate frequency, in step S704.

The FCC operation unit 504 reads the real count out of the real count calibrator 503, and transmits a difference between the thus read-out real count and the ideal count to the GPS signal processor 505, in step S705.

The GPS signal processor 505 receives radio signals transmitted from a GPS satellite, through the GPS antenna 506, receives the signal indicative of a difference between the calibrated real count and the ideal count, transmitted from the FCC operation unit 504, and processes signals relating to measurement of a position, in accordance with the difference indicated in the signal received from the FCC operation unit 504.

The mobile communication terminal 700 in accordance with the first embodiment provides the following advantages.

In the frequency calibration control (FCC), an operational frequency of the FCC unit 500 as a GPS module, which corresponds to a frequency of a signal transmitted from the oscillator 501, is calibrated by virtue of an accuracy of a frequency of a reference clock signal, which corresponds to a frequency of a signal output from the oscillator 105.

Specifically, a reference clock signal having a highly accurate frequency is counted in a predetermined period of time defined by a lowly accurate frequency of a signal transmitted from the oscillator 501, to thereby detect an error in a frequency of a signal transmitted from the oscillator 501. Then, the error is transmitted as the calibration data.

An accuracy with which frequency calibration is carried out in accordance with the frequency calibration control (FCC) would be higher, as a reference clock signal having a more accurate frequency is input, or a period of time during which the reference clock signal is counted is set longer. However, the accuracy is absolutely smaller than an accuracy of a frequency of the reference clock signal.

In the first embodiment, a signal transmitted from the oscillator 105 as a reference clock signal to be input into the FCC counter 502 is calibrated by the AFC function which the mobile communication terminal 700 inherently has. The AFC function is designed to keep an accuracy of a signal frequency necessary for communication, but the accuracy of the AFC function is not so high as an accuracy required in a GPS system. Accordingly, an accuracy of a frequency of a reference clock signal input into the FCC counter 502 often does not satisfy an accuracy required for a GPS module.

In order to solve this problem, the host CPU 600 estimates an error in a frequency of a signal transmitted from the oscillator 105, based on a real count of the intermediate frequency signal in the auto-frequency calibration, calculates deviation or offset caused in a real count of the reference clock signals in the frequency calibration control, based on the error, and outputs the offset to the real count calibrator 503 as a real count offset.

In actual operation, the host CPU 600 reads a real count of the intermediate frequency signal out of the AFC circuit 103, converts the thus read-out real count into a real count offset to be used in the frequency calibration control, in accordance with a conversion table or a conversion equation, and outputs the thus obtained real count offset to the real count calibrator 503.

Thus, the FCC unit 500 as a GPS module can theoretically acquire the same accuracy of a frequency as an accuracy of a frequency of a carrier wave transmitted from a base station, if later mentioned various error factors are not taken into consideration.

Hereinbelow are explained error factors in the frequency calibration to be carried out in the mobile communication terminal 700 in accordance with the first embodiment.

The error factors in the frequency calibration to be carried out in the mobile communication terminal 700 include an error in a count caused by a timing at which a count starts in the auto-frequency calibration, an error caused by turning a count into an integer, an error in calculation of a frequency of a signal transmitted from the oscillator 105, based on a count, an error in calculation of a real count offset, based on a frequency of a signal transmitted from the oscillator 105, an error in a count caused by a timing at which a count starts in the frequency calibration control, and an error caused by turning a count into an integer in the frequency calibration control, for instance.

Though dependent on a designed frequency of a signal transmitted from the oscillator 105, a designed frequency of the intermediate frequency signal, a period of time for counting signals in the auto-frequency calibration, a period of time for counting signals in the frequency calibration control, and so on, a total of the above-mentioned error factors corresponds to degradation smaller than about 0.1 ppm in an accuracy.

Accordingly, if a carrier wave transmitted from a base station has a completely accurate frequency, a final accuracy with which the calibration is carried out in the mobile communication terminal 700 is smaller than about 0.1 ppm.

In order to reduce the above-mentioned error factors, it would be effective to set a period of time for counting signals in both the auto-frequency calibration and the frequency calibration control, longer.

By designing the FCC counter 502 to count both rising-up and falling-down edges of a waveform of a signal transmitted from the oscillator 105 as a reference clock signal, it would be possible to have the same accuracy in the calibration as an accuracy obtained when the above-mentioned period of time is doubled.

As a reference clock signal has a greater designed frequency, an error factor corresponding to offset in a real count would be smaller, ensuring enhancement in an accuracy with which the calibration is carried out in accordance with the frequency calibration control.

As mentioned above, the FCC unit 500 as a GPS module can have the calibration data having an accuracy higher than an accuracy with which the calibration is carried out in accordance with the auto-frequency calibration. As a result, it is possible to significantly enhance an effective accuracy with which a frequency of a signal is calibrated in the frequency calibration control unit 500 as a GPS module, shorten a time necessary for detecting a position of a user or others, and enhance an accuracy with which a position is detected.

The present invention can be applied not only to a mobile communication terminal such as the mobile communication terminal 700 in accordance with the first embodiment, but also to other mobile communication terminals, if they have a function of auto-frequency calibration and can read out a count of signals in the auto-frequency calibration.

For instance, the present invention can be applied to a W-CDMA (Wideband-Code Division Multiple Access) type mobile communication terminal known as a next-generation cellular phone, if it is designed to have a function of auto-frequency calibration and can read out a count of signals in the auto-frequency calibration.

In the mobile communication terminal 700 in accordance with the first embodiment, the FCC operation unit 504 outputs the calibration data to the GPS signal processor 505. It would be possible to directly calibrate an operational frequency of the FCC unit 500 by feeding the calibration data back to the mobile communication terminal 700, that is, outputting the calibration data to the FCC counter 502.

For instance, it is possible to calibrate a frequency of a signal transmitted from the oscillator 501 by converting the calibration data into a control voltage in accordance with which the oscillator 501 is controlled, similarly to an AFC function of a PDC system.

As a result, it would be possible to carry out frequency calibration at an accuracy of about 0.1 ppm or smaller without using an oscillator transmitting a signal having a highly accurate frequency, by adding a GPS function to a mobile communication network, even it is a stand-alone type GPS.

Apart from GPS, any function among functions of a mobile communication terminal can be calibrated in accordance with the process explained in the above-mentioned first embodiment, if the function is required to calibrate a frequency at an accuracy higher than an accuracy with which a frequency is calibrated in mobile communication.

An operation of the AFC unit 100, the FCC unit 500 and the host CPU 600 constituting the mobile communication terminal 700 in accordance with the first embodiment can be accomplished by a computer program written in a language readable by a computer.

For operating the AFC unit 100, the FCC unit 500 and the host CPU 600 by means of a computer program, the host CPU 600 is designed to include a memory to store a computer program therein, for instance. The computer program is stored in the memory, and is read out into the host CPU 600 when the host CPU 600 starts its operation. Thus, such an operation of the host CPU 600 as mentioned above is accomplished in accordance with the computer program.

As an alternative, a recording medium storing such a computer program as mentioned above may be set into the host CPU 600 to be read out by the host CPU 600.

The functions of the host CPU 600 may be accomplished as a program including various commands, and be presented through a recording medium readable by a computer.

Figure 8:
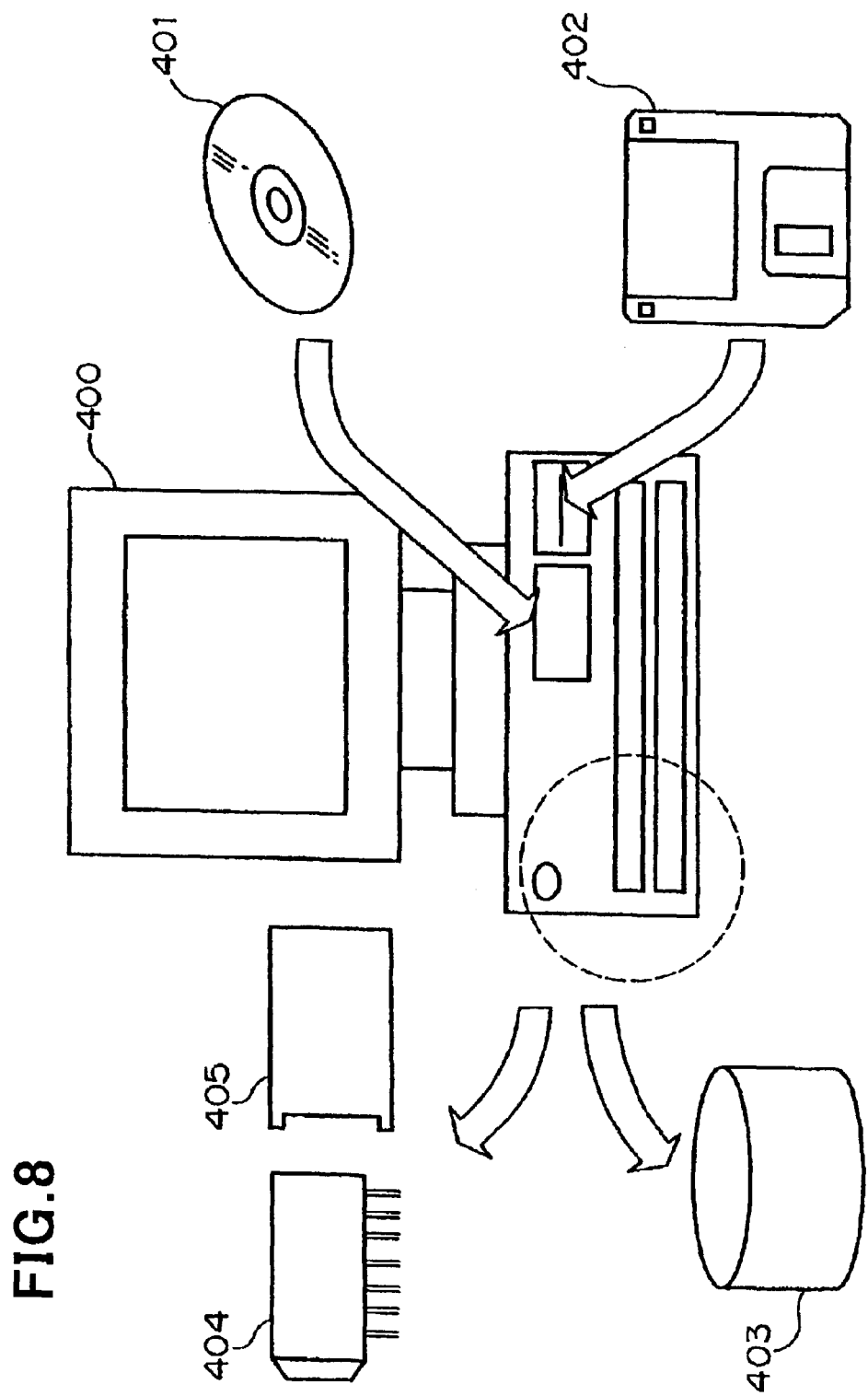
FIG. 8 illustrates examples of recording mediums in which a program for operating a mobile communication terminal is to be stored.

In the specification, the term "recording medium" means any medium which can record data therein. Examples of a recording medium are illustrated in FIG. 8.

The term "recording medium" includes, for instance, a disk-shaped recorder 401 such as CD-ROM (Compact Disk-ROM) or PD, a magnetic tape, MO (Magneto Optical Disk), DVD-ROM (Digital Video Disk-Read Only Memory), DVD-RAM (Digital Video Disk-Random Access Memory), a floppy disk 402, a memory chip 404 such as RAM (Random Access Memory) or ROM (Read Only Memory), EPROM (Erasable Programmable Read Only Memory), EEPROM (Electrically Erasable Programmable Read Only Memory), smart media (Registered Trade Mark), a flush memory, a rewritable card-type ROM 405 such as a compact flush card, a hard disk 403, and any other suitable means for storing a program therein.

A recording medium storing a program for accomplishing the above-mentioned apparatus may be accomplished by programming functions of the above-mentioned apparatuses with a programming language readable by a computer, and recording the program in a recording medium such as mentioned above.

A hard disc equipped in a server may be employed as a recording medium. It is also possible to accomplish the recording medium in accordance with the present invention by storing the above-mentioned computer program in such a recording medium as mentioned above, and reading the computer program by other computers through a network.

As a computer 400, there may be used a personal computer, a desk-top type computer, a note-book type computer, a mobile computer, a lap-top type computer, a pocket computer, a server computer, a client computer, a workstation, a host computer, a commercially available computer, and electronic exchanger, for instance.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2002-133581 filed on May 9, 2002 including specification, claims, drawings and summary is incorporated herein by reference in its entirety.

What is claimed is:

1. A mobile communication terminal including:
   (a) a first unit for calibrating a frequency;
   (b) a global positioning system (GPS) module; and
   (c) a processor which electrically connects said first unit and said global positioning system module to each other,
   wherein said first unit counts the number of an intermediate frequency (IF) signal generated by converting a frequency of a signal transmitted from a base station,
   said processor converts a count of said intermediate signal obtained while said first unit is in lock-up condition, into a real count offset, and
   said global positioning system module counts the number of a signal transmitted from a circuit which generates an operational frequency of said mobile communication terminal, and calibrates said number of said signal with said real count offset.

2. The mobile communication terminal as set forth in claim 1, wherein said first unit is comprised of:
   (a1) a down-converter which converts a frequency of a signal transmitted from a base station, and transmits an intermediate frequency (IF) signal;
   (a2) an auto-frequency calibration (AFC) circuit which counts the number of said intermediate signal transmitted from said down-converter;
   (a3) a digital-analog converter which converts a voltage transmitted from said auto-frequency calibration circuit, into analog data; and
   (a4) a first circuit which generates an operational frequency of said mobile communication terminal, and transmits a frequency signal indicative of said operational frequency.

3. The mobile communication terminal as set forth in claim 2, wherein said processor reads a count of said intermediate frequency signal out of said auto-frequency calibration circuit while said first unit is in lock-up condition, converts the thus read-out count into a real count offset, and outputs said real count offset.

4. The mobile communication terminal as set forth in claim 3, wherein said processor estimates an error in said operational frequency of said mobile communication terminal, based on said count of said intermediate frequency signal, calculates offset in said real count transmitted from said auto-frequency calibration circuit, based on said error, and outputs said offset as said real count offset.

5. The mobile communication terminal as set forth in claim 4, wherein said processor reads out said count of said intermediate frequency signal, and converts said count of said intermediate frequency signal into said real count offset in accordance with a conversion table or a conversion equation.

6. The mobile communication terminal as set forth in claim 2, wherein said global positioning system module is comprised of:
   (b1) a second circuit which generates an operational frequency of said global positioning system module;
   (b2) a counter which counts said frequency signal calibrated by said first unit;
   (b3) a real count calibrator which receives a real count transmitted from said counter and a real count offset transmitted from said processor, and calibrates said real count with said real count offset;
   (b4) a calculator which calculates a difference between said real count calibrated by said real count calibrator, and an ideal count, and outputs a calibration signal indicative of the thus calculated difference; and
   (b5) a GPS signal processor which receives said calibration signal and a signal transmitted from a global positioning system satellite, and processes signals relating to measurement of position.

7. The mobile communication terminal as set forth in claim 6, wherein said real count calibrator adds said real count offset transmitted from said processor, to said real count transmitted from said counter, to thereby calibrate said real count.

8. The mobile communication terminal as set forth in claim 6, wherein said counter counts both of a rising-up edge and a falling-down edge of a waveform of the received frequency signal.

9. The mobile communication terminal as set forth in claim 6, wherein said calibration signal transmitted from said calculator is fed back to said counter.

10. The mobile communication terminal as set forth in claim 6, wherein said calibration signal transmitted from said calculator is converted into a control voltage in accordance with which a frequency transmitted from said second circuit is calibrated.

11. A method of calibrating a frequency in a mobile communication terminal, comprising:
    (a) counting the number of an intermediate frequency (IF) signal generated by converting a frequency of a signal transmitted from a base station;
    (b) converting a count of said intermediate signal obtained while a first unit for calibrating a frequency in said mobile communication terminal is in lock-up condition, into a real count offset; and
    (c) counting the number of a frequency signal transmitted from a circuit which generates an operational frequency of said mobile communication terminal, and outputs said frequency signal indicative of said operational frequency, and calibrating said number of said frequency signal with said real count offset.

12. The method as set forth in claim 11, wherein said real count is calibrated by adding said real count offset to said real count in said (c).

13. The method as set forth in claim 11, wherein said (b) comprises:
    estimating an error in said operational frequency of said mobile communication terminal, based on said count of said intermediate frequency signal;
    calculating offset in said real count of said intermediate frequency signal, based on said error; and
    outputting said offset as said real count offset.

14. The method as set forth in claim 11, wherein said (b) comprises:
    reading out said count of said intermediate frequency signal; and
    converting said count of said intermediate frequency signal into said real count offset in accordance with a conversion table or a conversion equation.

15. The method as set forth in claim 11, wherein both of a rising-up edge and a falling-down edge of a waveform of said frequency signal are counted in said (c).

16. A computer-readable storage medium containing a set of instructions for causing a computer to carry out a method of calibrating a frequency in a mobile communication terminal, the set of instructions comprising:

(a) counting the number of an intermediate frequency (IF) signal generated by converting a frequency of a signal transmitted from a base station;

(b) converting a count of said intermediate signal obtained while a first unit for calibrating a frequency in said mobile communication terminal is in lock-up condition, into a real count offset; and (c) counting the number of a frequency signal transmitted from a circuit which generates an operational frequency of said mobile communication terminal, and outputs said frequency signal indicative of said operational frequency, and calibrating said number of said frequency signal with said real count offset.

17. The computer-readable storage medium containing a set of instructions as set forth in claim 16, wherein said real count is calibrated by adding said real count offset to said real count in said (c).

18. The computer-readable storage medium containing a set of instructions as set forth in claim 16, wherein said (b) includes:

estimating an error in said operational frequency of said mobile communication terminal, based on said count of said intermediate frequency signal;

calculating offset in said real count of said intermediate frequency signal, based on said error; and outputting said offset as said real count offset.

19. The computer-readable storage medium containing a set of instructions as set forth in claim 16, wherein said (b) includes:

reading out said count of said intermediate frequency signal; and converting said count of said intermediate frequency signal into said real count offset in accordance with a conversion table or a conversion equation.

20. The computer-readable storage medium containing a set of instructions as set forth in claim 16, wherein both of a rising-up edge and a falling-down edge of a waveform of said frequency signal are counted in said (c).

21. A storage means readable by a computer, storing a set of instructions defined in claim 16.

* * * * *